(12) United States Patent
Davidson et al.

(10) Patent No.: US 8,851,159 B1
(45) Date of Patent: *Oct. 7, 2014

(54) METHOD AND PATTERN OF DISPENSING THERMAL INTERFACE MATERIALS

(75) Inventors: Drew A. Davidson, Endicott, NY (US); Bahgat G. Sammakia, Binghamton, NY (US)

(73) Assignee: The Research Foundation for The State University of New York, Binghamton, NY (US)

( * ) Notice: Subject to any disclaimer, the term of this patent is extended or adjusted under 35 U.S.C. 154(b) by 1334 days.

This patent is subject to a terminal disclaimer.

(21) Appl. No.: 12/628,157

(22) Filed: Nov. 30, 2009

Related U.S. Application Data

(60) Provisional application No. 61/118,853, filed on Dec. 1, 2008.

(51) Int. Cl.
*A61C 5/06* (2006.01)
(52) U.S. Cl.
USPC ............................ 165/186; 361/710; 427/369
(58) Field of Classification Search
USPC .......... 165/185, 186; 361/704, 710, 718, 722; 427/369, 355
See application file for complete search history.

(56) References Cited

U.S. PATENT DOCUMENTS

| | | | |
|---|---|---|---|
| 7,282,799 B2 * | 10/2007 | Brunschwiler et al. | 257/718 |
| 7,394,657 B2 * | 7/2008 | Hoivik et al. | 361/704 |
| 7,464,462 B2 * | 12/2008 | Edwards et al. | 29/890.03 |
| 7,550,097 B2 * | 6/2009 | Tonapi et al. | 252/512 |
| 7,876,565 B2 * | 1/2011 | Hoivik et al. | 361/704 |
| 7,961,469 B2 * | 6/2011 | Schmidt et al. | 361/705 |
| 8,481,103 B1 * | 7/2013 | Davidson et al. | 427/58 |
| 8,564,955 B2 * | 10/2013 | Schmidt et al. | 361/705 |
| 2004/0104014 A1 * | 6/2004 | O'Connor et al. | 165/104.33 |
| 2006/0286712 A1 * | 12/2006 | Brunschwiler et al. | 438/106 |
| 2007/0175621 A1 * | 8/2007 | Datta et al. | 165/185 |

* cited by examiner

*Primary Examiner* — Marc Norman
*Assistant Examiner* — Devon Russell
(74) *Attorney, Agent, or Firm* — Steven M. Hoffberg; Ostrolenk Faber LLP

(57) ABSTRACT

An interface is formed by pressing a first surface and a second surface together, with a particle-loaded thermal interface material (TIM) in between. By applying the thermal interface material to controlled locations on the first surface in controlled amounts, final layer thickness at a given squeezing pressure, and time required to squeeze, are minimized. The locations and amounts are controlled such that small islands of TIM merge only just before final layer thickness is achieved. Better TIM thermal performance and quicker manufacturing result.

23 Claims, 13 Drawing Sheets

- Surface micro-channel pattern 3-1 (~6% of area covered)

- Surface micro-channel pattern 3-9 (~36% of area covered)

image from Brunschwiler et al. 2007

Dispensing Patterns Used

For plain chips:

Lines on chip diagonals

Herringbone pattern

Fine parallel lines

For surface micro-channel pattern 3-1:

Lines on chip diagonals

Lines on sub-plate diagonals

For surface micro-channel pattern 3-9:

Dot array

Herringbone pattern

Lines on chip diagonals

All samples with surface micro-channels exhibited air voiding in the channels, as observed by X-ray (Arctic Silver Ceramique High Density)

METHOD AND PATTERN OF DISPENSING THERMAL INTERFACE MATERIALS

FIELD OF THE INVENTION

This invention relates to a method of forming thin fluidic layers and particularly relates to thermal interfaces between microprocessor chips and cooling devices.

BACKGROUND OF THE INVENTION

In the field of microelectronic chip packages, greater performance is obtained through continuous increase of power density, leading to continuous increase in rate of heat removal required (Mahajan et al. 2006). Thermal resistance at the interface between the chip package and a cooling device is a major impediment to heat removal. This thermal resistance is typically reduced by insertion of a thermal interface material. Thermal interface material layers are typically formed by pressing the thermal interface material between a flat surface of the microprocessor chip and a flat surface of a cooling device. A typical TIM is a polymeric liquid which is filled to a large volume fraction with micron-size solid particles.

Such TIMs conduct heat better when highly filled with solid particles, but such filling substantially increases the TIM effective viscosity and yield stress. Thin layers of TIM are desired for low thermal resistance, but formation of such thin layers by squeezing flow can require dangerously large forces and long squeezing times, due to the increased effective viscosity and yield stress of a highly-filled TIM. There exists a need to form thinner layers of such TIMs more rapidly, with reduced squeezing force.

Brunschwiler et al. (US 200610286712 A1) achieve this aim by cutting channels in the surfaces of the microprocessor chip and/or the cooling device. Such cutting of channels requires additional manufacturing time and expense.

It is the aim of the present invention to provide a method of forming thinner TIM layers more rapidly, with reduced squeezing force, and to avoid a requirement for modifying the microprocessor chip and/or cooling device.

SUMMARY OF THE INVENTION

According to a first aspect of the present invention, TIM is applied to a first surface of a heat dissipating element, such as a microprocessor chip or a heat sinking element, such as a cooling device, in locations and in amounts which are chosen based on an understanding of the fluid mechanics of squeezing flow.

The amount and pattern may be predetermined based on the application type, or adaptively determined based on the characteristics of the surfaces or devices to be thermally interfaced.

An array of separate fluid regions, individually surrounded by ambient gas, or in some cases, another fluid having lower viscosity, will squeeze faster, with less force, to thinner layers, in comparison to squeezing a continuous fluid layer. These improvements are maximized by keeping the separate high viscosity TIM fluid regions as small as possible throughout the layer formation process. The deposit locations and amounts are chosen such that the separate fluid regions finally merge together shortly before the TIM layer reaches its final state, at a time when the TIM layer thickness is virtually the final layer thickness.

Trapped gasses in the final TIM layer must be minimized because they degrade thermal and mechanical performance; they can be minimized by squeezing the TIM in reduced ambient pressure, and/or properly designing the deposit locations and amounts such that continuous escape paths exist for gasses until fluid regions finally merge.

In some cases, at least one of the surfaces can be provided with apertures, porosity, or pathways to facilitate gas escape.

An analysis may therefore be performed of the surface conditions and configuration, TIM material and surrounding gas (or liquid) at the time of TIM compression, and compression conditions, to optimize the TIM deposition pattern prior to contacting the surfaces, seeking to achieve the desired end product, a thin TIM between two mating surfaces with minimal entrapped non-TIM material, and under defined compression conditions during application.

In a more complex application, a plurality of types of TIM material may be provided, having different characteristics, provided in a heterogeneous pattern. In this case, the goal is, for example, to provide a minimum layer thickness of high thermal conductivity material proximate to a region of required high thermal conductivity, and a material of lower thermal conductivity, presumably with lower viscosity, in another region where lower thermal conductivity can be tolerated. The heterogeneously disposed materials permit the formation of a TIM layer, for example, which allows a device to operate at lower temperature of operation, especially in a region of a thermally sensitive component, than a corresponding traditionally formed TIM at the same application pressure for formation of the TIM film.

According to another embodiment, the TIM is filled with isotropic particles which tend to be aligned after deposition from an application nozzle, leading to isotropic thermal conductivity patterns and possibly isotropic flow patterns under compression. The pattern of deposition of such a material is defined to optimize the properties of the film during formation and resulting TIM, with respect to the design requirements. Thus, in the case of an isotropic particle filled TIM material, the final film thickness, heat conduction properties, and application conditions (including application pressure), can be optimized in conjunction with the pattern of deposition.

By modeling the flow pattern with a computer program executing on a general purpose computer or specialized device, the optimal deposition pattern for a given TIM for a given environment may be determined in advance. However, the deposition pattern may also be determined empirically. The flow pattern modeling itself may be of known type, such as "Flow-3D" software (Flow Science Inc., Santa Fe, N. Mex.); Ebner, J.; Schober, P.; ANSYS CFD software (www-.fluent.com/software/index.htm, ANSYS, Inc., Lebanon, N.H.), etc. Typically, a personal computer or workstation is a suitable platform; however, in some cases, a computing grid, cluster, or supercomputer may be useful.

Typically, an experiment is conducted to determine force deflection of one or both surfaces when the TIM is compressed between them. Typically, gas space will deflect the surface less than the TIM, which has increased stiffness due to its viscosity.

In most cases, the planarity of the surfaces may be considered sufficiently uniform and consistent that it may be ignored as a source of deviation between samples, and indeed, typically the deformation of the surfaces under mutual compression during formation of the TIM film may be ignored. On the other hand, in other cases, these considerations may be the basis for useful or even important parameters in the optimization process. As the process is optimized, the thermal conductivity of the final TIM is maximized and/or the compression required to achieve the final state controlled or minimized and/or undue stresses avoided in critical parts of the devices subjected to compression which achieving sufficient thermal performance.

The defined pattern for a TIM film in a module may be a regular repeating pattern over a spatial area on a surface, or the pattern may be spatially varying. For example, a drop of TIM in the center of a compressed surface will tend to spread outward. Therefore, in order to maintain air flow passages to allow all trapped gas to be expelled, the density of drops or an elongated deposition pattern may tend to be lower near the edges of the surfaces. In many cases, the two surfaces to be interfaced are initially placed parallel to each other, and then compressed along the normal axis. In another case, the surfaces are inclined with respect to each other, and the TIM on one edge contacts the other surface first. The angle of the surfaces is then adjusted until they are nearly coplanar.

A planometer may be used to determine flatness of one or both surfaces to be interfaced. The pattern of TIM may be deposited to compensate for irregularities on the surface(s), such that, for example, at least the criterion for patent air passages to permit escape of gas remain until the module is compressed to a desired layer thickness. An optical or laser planometer may be used, for example, to determine an actual profile of each surface to be interfaced, and the optimized deposition pattern determined in dependence thereon. Typically, assuming small variations in planarity, small differences in the amount of TIM at various locations may be made. However, the optimization may also vary the location of droplets, deposition lines, and/or defined air passages which are obliterated just prior to completion of compression.

In the case of anisotropic particles, the spreading behavior under compression may be more complex than in the case of isotropic particles. Likewise, the deposition pattern (except in the case of simple droplets) should be defined not only by the resulting pattern, but also by its path of deposition. After compression, the thermal properties of the TIM made with anisotropic particles may also be dependent on the original deposition pattern. Since the thickness of the film and the thermal properties of the material which forms the film at any location both interact to define the resulting thermal properties of the film, the optimal deposition pattern from a heat transfer standpoint may one which results in a thicker film than that which results in minimum film thickness.

Even in the case of isotropic particle loaded TIMs, there may be some segregation, partition or proportionation of particles within the TIM, and intentionally or unintentionally, air spaces may remain in the completed module. Therefore, it is preferable to deposit the TIM over the "hot spots" or heat sensitive portions of the electronic device, which will generally lead to highest thermal conductivity at those locations after compression of the TIM between the surfaces. This is because the fluid component of the TIM will tend to flow more than the particulates, leaving a particle-rich zone where the original drop or line of TIM was placed, and a less dense region where the TIM material has flowed.

It is therefore an object of the invention to provide a method of dispensing and a resulting thermal interface comprising providing a first surface, a second surface, and a flowable substantially heat-conducting interface material, and disposing the interface material between the first surface and the second surface in sufficiently many locations and sufficiently small amounts such that many islands of interface material spread out to form a thin homogeneous final layer for example, in minimal time and/or with minimal squeezing force. More generally, optimization criteria may be applied according to one or more of, but not limited to, processing time, peak squeezing force, average squeezing force, squeezing force profile, thermal conductivity, TIM module operating temperature, prescribed thermal and/or temperature conductivity as a function of location, peak operating temperature as a function of location, module cost, cost-benefit, and module yield. The locations may comprise, for example, dots or parallel lines. The locations and the amounts may be selected such that the shear yield stress of the TIM will terminate the squeezing just after the final continuous TIM layer is achieved. The locations and the amounts may be selected such that particle agglomeration will terminate the squeezing just after the final continuous TIM layer is achieved. The pressure of the gas surrounding the TIM may be reduced during film compression. The lines may be spaced at a pitch smaller than 10% of a side length of said first surface. The TIM may be formed as a set of islands, for example in which the islands number 10 or more. The squeezing pressure to form the film may be, for example, less than about 10 psi. The thickness of the final layer is preferably 20 microns or smaller.

DETAILED DESCRIPTION OF THE INVENTION

Figure 1:
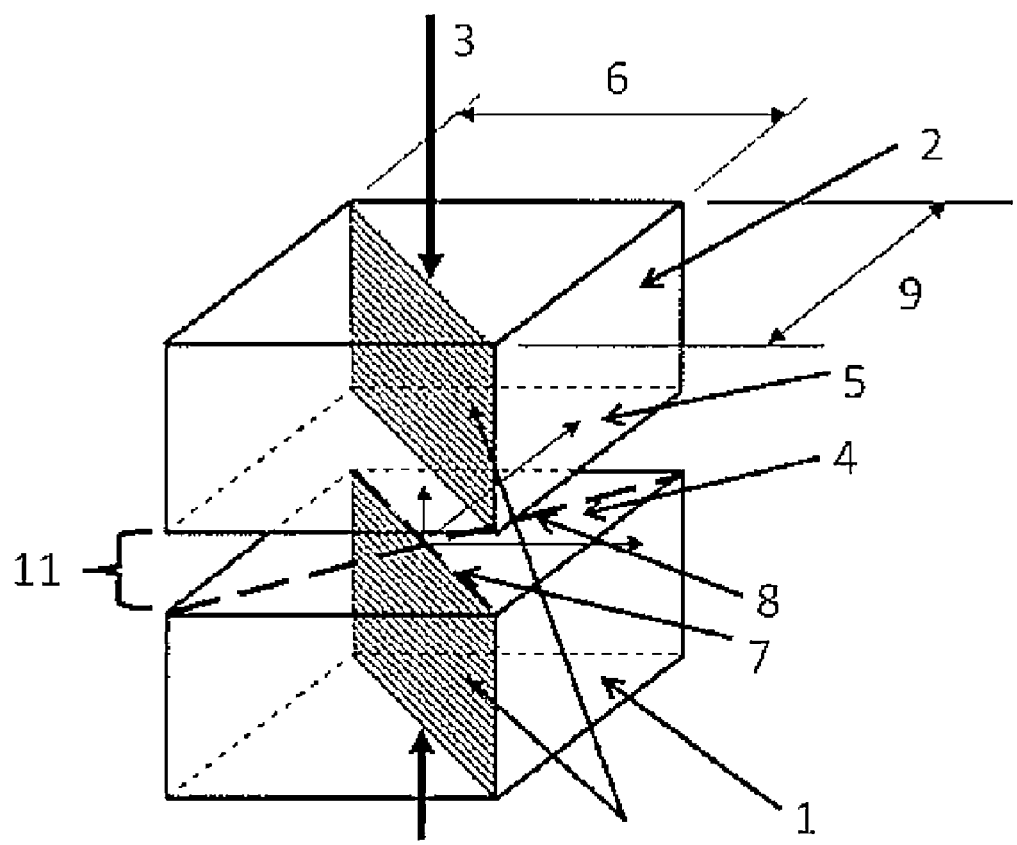
FIG. 1 depicts the geometry of TIM layer formation by squeezing flow.

FIG. 1 shows a schematic of TIM layer formation by squeezing flow. TIM (not shown) is squeezed between substantially flat surface 4 of object 1, and substantially flat surface 5 of object 2. Objects 1 and 2 may represent a microprocessor chip and a cooling device. A fluidic TIM is applied in select amounts, in select locations, on surface 4. Squeezing force 3 is applied to objects 1 and 2 so that the TIM spreads out over surface 4, ultimately forming a substantially continuous layer between objects 1 and 2 of thickness 11, width 6, and depth 9. It is known in the art to apply fluidic TIM exclusively to main diagonals 7 and 8 of surface 4; this application is favored in the art for avoiding trapped gasses in the TIM layer. The prior art dispense has proved inadequate for formation of sufficiently thin TIM layers, as evidenced by the work of Brunschwiler et al. (US 2006/0286712 A1).

Figure 2:
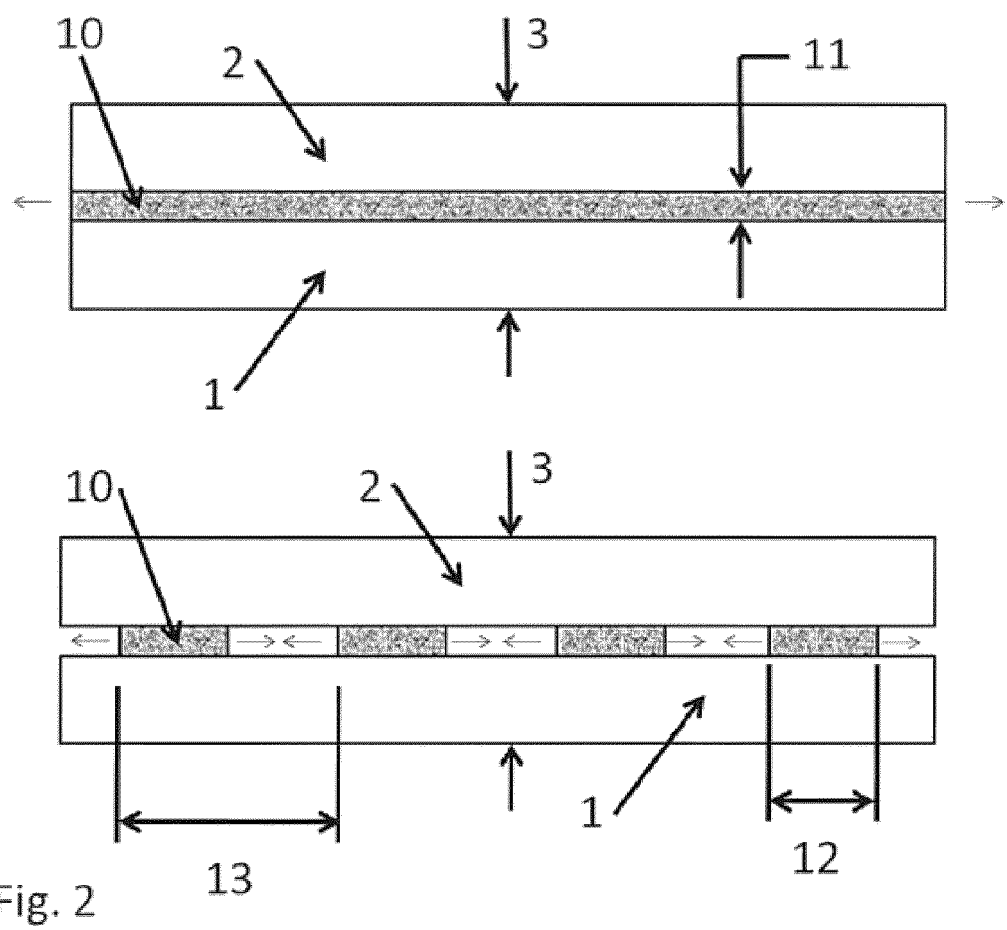
FIG. 2 shows cross-sectional views of TIM layer formation by squeezing flow, and compares squeezing a continuous layer to squeezing a first embodiment of the present invention.
Figure 3:
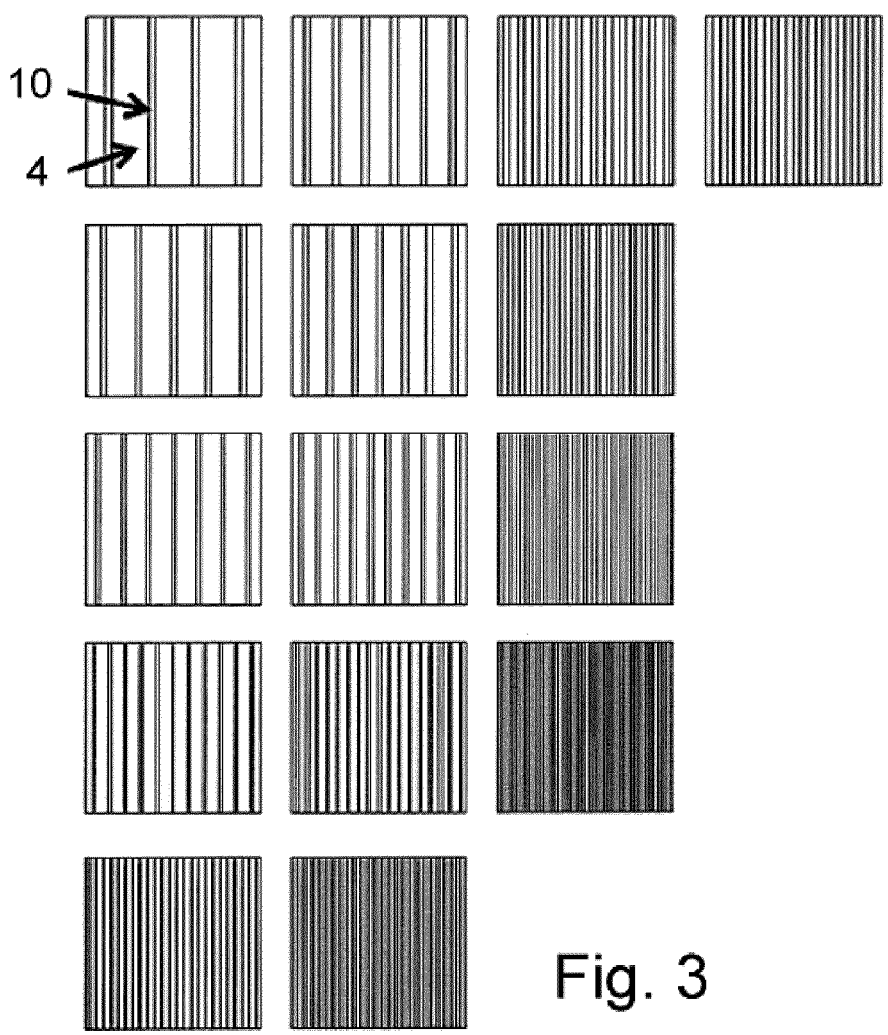
FIG. 3 shows various initial TIM deposition patterns according to a first embodiment of the present invention.

The lower half of FIG. 2 shows a first embodiment of the present invention. TIM 10 is applied in narrow parallel lines to surface 4 of object 1. The narrow lines are initially separated by ambient gas. Application of squeezing force 3 causes the lines to spread out and meet. By virtue of the small width of the TIM lines, the final layer thickness and the squeezing time are substantially reduced in comparison to squeezing a thick continuous layer (top half of FIG. 2). Said reduction is maximized by choosing the dispensed amount per line and line pitch such that lines meet just before the final layer thickness is achieved. Final layer thickness is typically a function of shear yield stress and/or particle agglomeration. Amount of gasses trapped between the lines 10 can be minimized by depositing slightly greater amounts of TIM at the midsection of each line versus the ends of each line, and/or reducing the ambient pressure of gasses. FIG. 3 shows initial arrangements of lines 10 on surface 4, for four different squeezing forces (left to right), and five different initial widths of line 10 (top to bottom). The squeezing pressures in FIG. 3 may be 1, 3, 10, 20 psi, and the initial widths of lines 10 may be 200, 370, 550, 720, and 890 microns.

Figure 4:
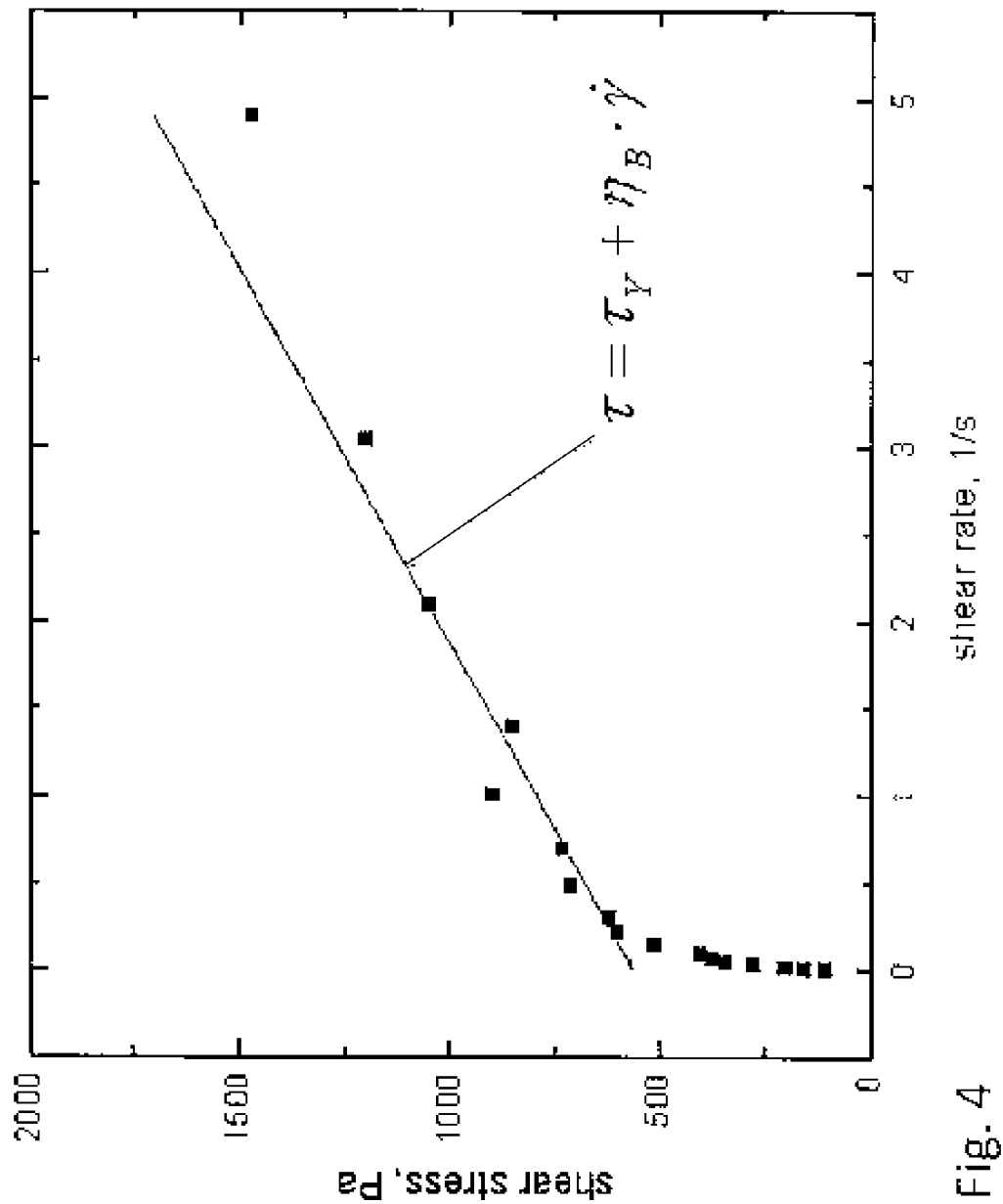
FIG. 4 shows a flow curve of one TIM, indicating the material properties used to design TIM deposition patterns.
Figure 5:
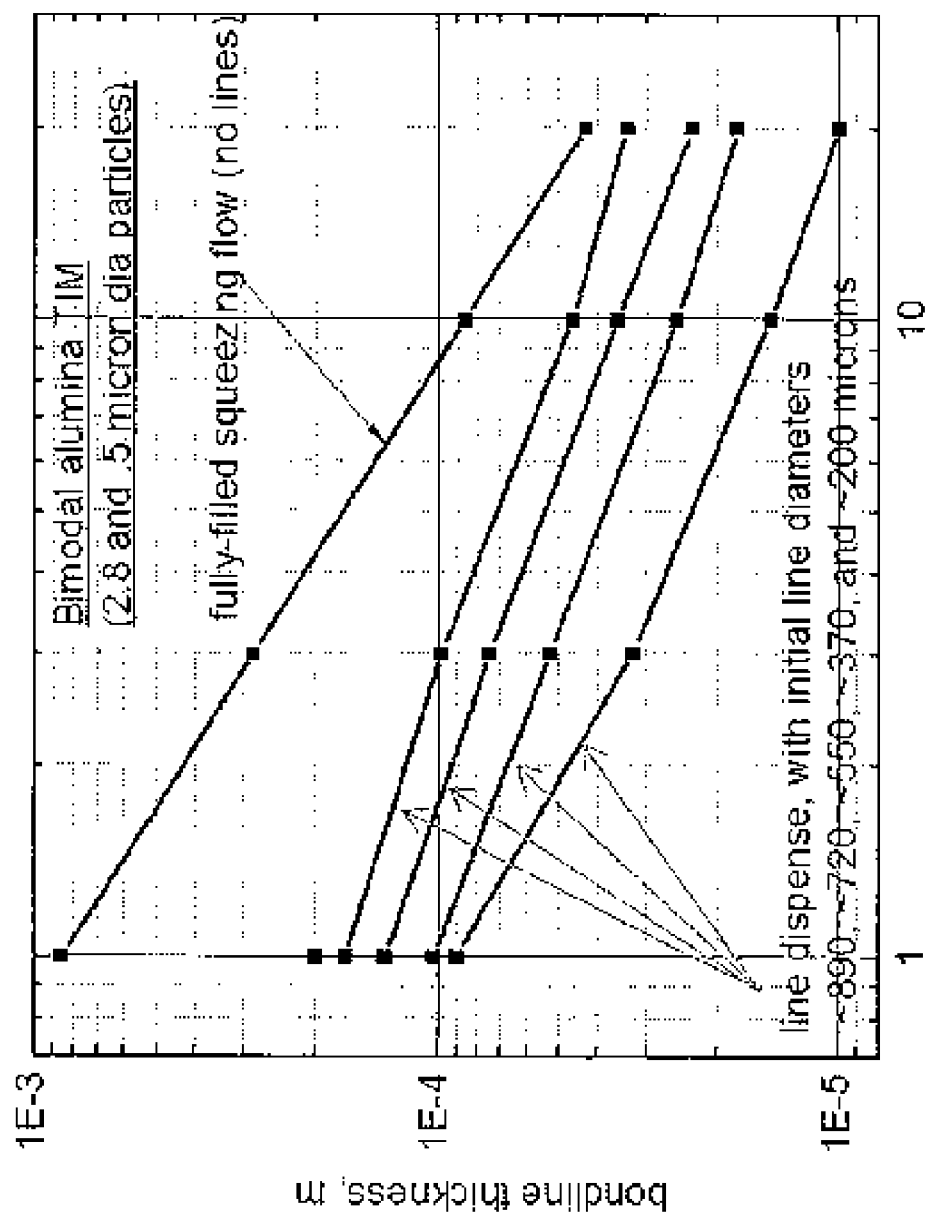
FIG. 5 compares final TIM layer thickness produced by constant force squeezing of a continuous TIM layer and a first embodiment of the present invention.
Figure 6:
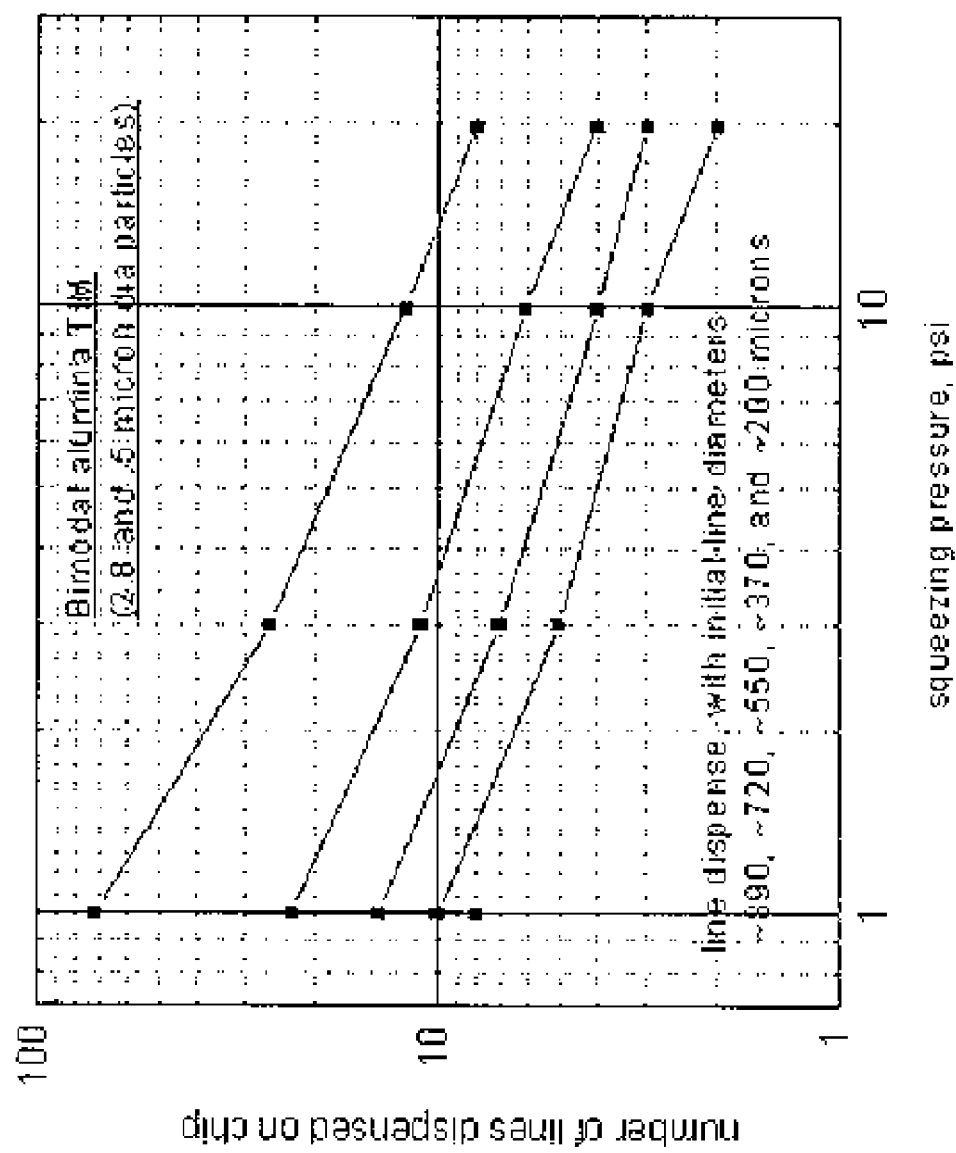
FIG. 6 shows details of line geometry for a first embodiment of the present invention.

FIG. 4 shows rheological parameters of a TIM (chosen from data reported by Sushumna et al. 1991) measured using a parallel-plate viscometer: the shear yield stress and the Bingham viscosity. These parameters can be used to select dispense locations and dispense amounts in accordance with the present invention. For the first embodiment of the present invention shown in the lower half of FIG. 2, a fluid mechanics analysis based on that of Covey and Stanmore (1981) relates the final thickness (1 1 in FIG. 1) HL. of an isolated line of final width w (12 in FIG. 2) to squeezing pressure Ps applied to objects 1 and 2 (Ps is force 3 divided by the product of lengths 6 and 9):

$$H_L = \frac{\tau_y \cdot w^2}{2 \cdot P_S \cdot \text{pitch}} \quad (1)$$

wherein "pitch" is the line pitch 13 in FIG. 2 and the shear yield stress of the TIM is $\tau_y$. To minimize trapped gasses, w should be approximately larger than "pitch." FIG. 5 and FIG. 6 illustrate the use of Eq. (1) in designing patterns of dispensed lines (such as those shown in FIG. 3) for one TIM studied by Sushurnna et al. 1991 such that a thinner continuous TIM layer is formed with reduced squeezing pressure on a 1" chip (lengths 6 and 9 in FIG. 1 are 1").

The location of the TIM may be determined empirically, or algorithmically, using an optimization criteria for optimizing solely or jointly one or more of processing time, peak squeezing force, average squeezing force, squeezing force profile, thermal conductivity, operating temperature, prescribed thermal conductivity as a function of location, prescribed temperature conductivity as a function of location, peak operating temperature as a function of location, cost, cost-benefit, and yield. Typically, for development of a suitable algorithm, the TIM will be deposited in an array of droplets or lines. A module formed with that TIM deposition pattern is then constructed and tested against a best prior example according to the optimization criteria. A genetic algorithm may then be employed, in conjunction with computational flow dynamics software and an appropriate model (modified as may be appropriate to reflect the results of experimentation) to alter the TIM deposition pattern seeking an optimal solution, with routine testing after each iteration. Of course, a skilled worker may guide the process, but that is not necessary.

The skilled person will be aware of alternatives to the first embodiment of the present invention discussed above, which might include arrays of dots (hexagonal close packing for example), arrays of asterisks (*), meshing gears, or any suitable dispense pattern such that fluid regions remain small in area compared to the chip area (product of lengths 6 and 9 in FIG. 1) and separated by ambient gasses until the layer thickness is virtually the final value. Preferably, the dispense pattern creates escape paths for the ambient gasses. An experimental study of Arctic Silver Ceramique (High Density) was conducted, to investigate thermal grease layer formation on plain chips versus chips with surface micro-channels.

Figure 7A:
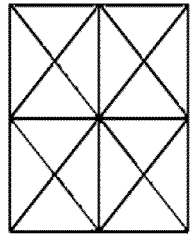
FIGS. 7A and 7B show comparisons of the compositions tested by assembling a patterned chip die on a heatsink, by quickly squeezing at either 23 psi or 79 psi (100 N or 350 N), respectively.
Figure 7B:
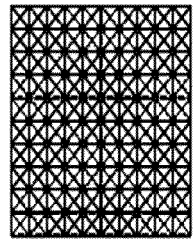
Figure 8:
FIG. 8 shows a series of testing patterns.
Figure 8:
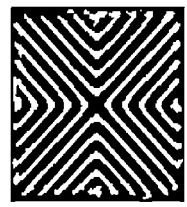
Figure 8:
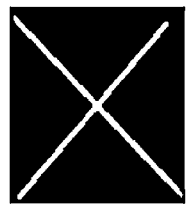
Figure 8:
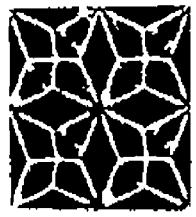
Figure 8:
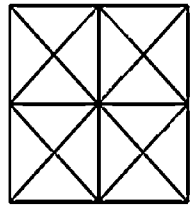
Figure 8:
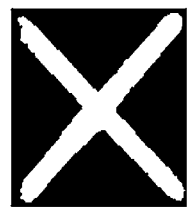
Figure 8:
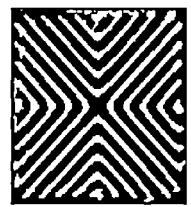
Figure 8:
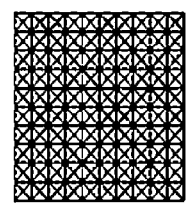

One consideration is the dispensing pattern for the deposition, and therefore a series of patterns were tested, as shown in FIG. 8, presenting various dispensing patterns and respective amounts of thermal grease composition. The compositions were tested by assembling a patterned chip die, as shown in FIGS. 7A and 7B on a heatsink, by quickly squeezing at either 23 psi or 79 psi (100 N or 350 N). Results of this test are shown in FIGS. 9-12.

According to the manufacturer, Arctic Silver, the Ceramique High Density Thermal Grease contains five shapes of alumina, boron nitride, and zinc oxide sub-micron particles (average<0.38 microns). At high temperature, viscosity initially drops for layer thinning and surface conformability, then rises over 100-300 hours for long-term stability/resistance to pump-out. The thermal resistance at a 25 micron bond line is claimed to be better than 5E-6 K/(W/m$^2$). The composition is also stated as having long term stability to 125° C.

Advantageously, micromachining technologies may be employed to produce microchannels on a silicon substrate. Typically, in an active heat dissipating device, the microchannels are formed on an inactive face of the device, though so long as the electrical properties of an active device and/or its interconnections (e.g., bond wires) are not interfered with by the thermal grease or heatsink, it may also be possible to pattern an active surface of a heat-dissipating semiconductor apply the heatsink directly to the heat dissipating surface. Further, the microchannels need not be provided principally for guiding the thermal grease, and in fact may be a functional part of the semiconductor or other heat dissipating device. Thus, an active semiconductor may employ deep trenches to increase surface area, and these same trenches may be used to channel a thermally conductive compound during packing and mounting.

Silicon test chips, as shown in FIGS. 7A (pattern 3-1, ~6% of area covered) and 7B (pattern 3-9, ~36% of area covered), were supplied by Nova Wafer, having dimensions of 1.6 mm×25.4 mm×25.4 mm. The side with channels was lapped and polished. The other side was lapped, then coated with 250 Å Cr under 1000 Å Au. The channels were generated with a dicing saw, having channel dimensions of 200 microns by 200 microns.

Figure 9:
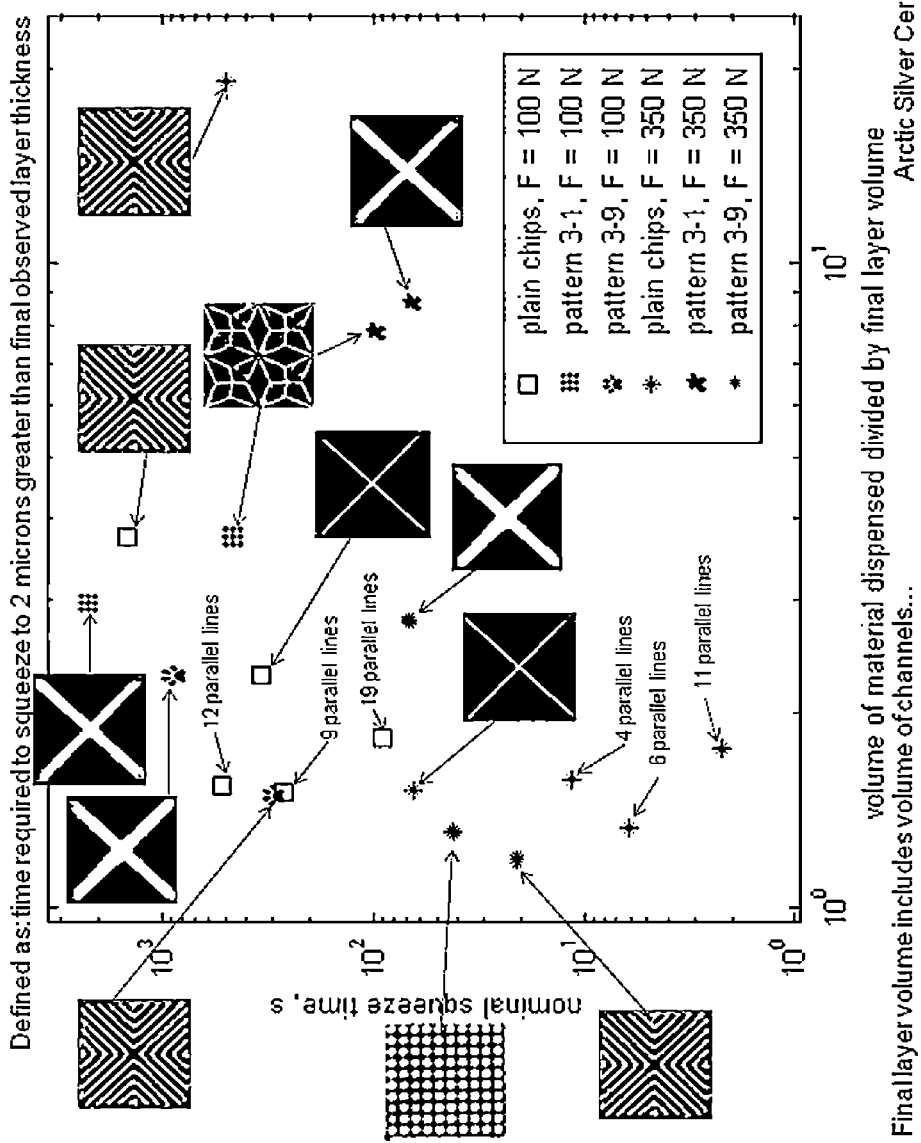
FIGS. 9-12 show results of the tests of the patterns shown in FIG. 8
Figure 10:
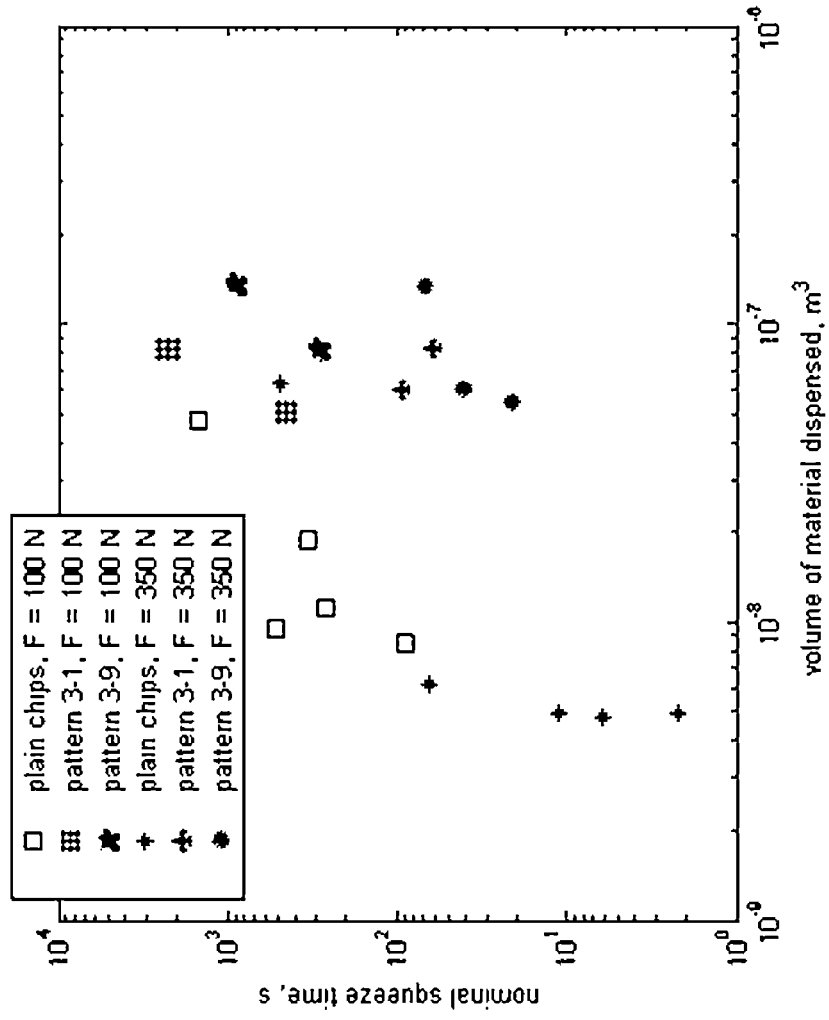

The squeezing time to achieve a layer thickness of <2 microns was measured, as shown in FIGS. 9 and 10. However, looking at squeezing time alone can be misleading, since a heavy dispense might abruptly stop squeezing at a thick layer. Squeezing time is highly sensitive to deposition pattern. The key to fast squeezing is to deposit small islands which meet just before the layer thickness has reached its minimum, with minimum required deformation ("nearly final shape"). Samples with surface micro-channels cope with heavy dispenses better than plain chips. The time to squeeze to final layer thickness is relatively hard to quantify because of the asymptotic nature of the curve. Therefore, a particular choice was made, to which the results were sensitive. However, it is believed that the overall experimental conclusions remain valid for a range of different squeeze time measurement techniques.

The squeezing time for the design of FIG. 7A (channels 3-1) was roughly comparable to that of FIG. 7B (channels 3-9), despite a large difference in fraction of chip area covered by surface micro-channels (36% versus 6%). Samples with fine parallel lines on plain chips squeezed at least as quickly as samples with many deep surface micro-channels.

Dispensing in fine lines increases squeezing speed (at equal force) in comparison to squeezing a fully-filled layer at the same layer thickness. All of the layer thicknesses are not large compared to measurement error/noise.

Figure 11:
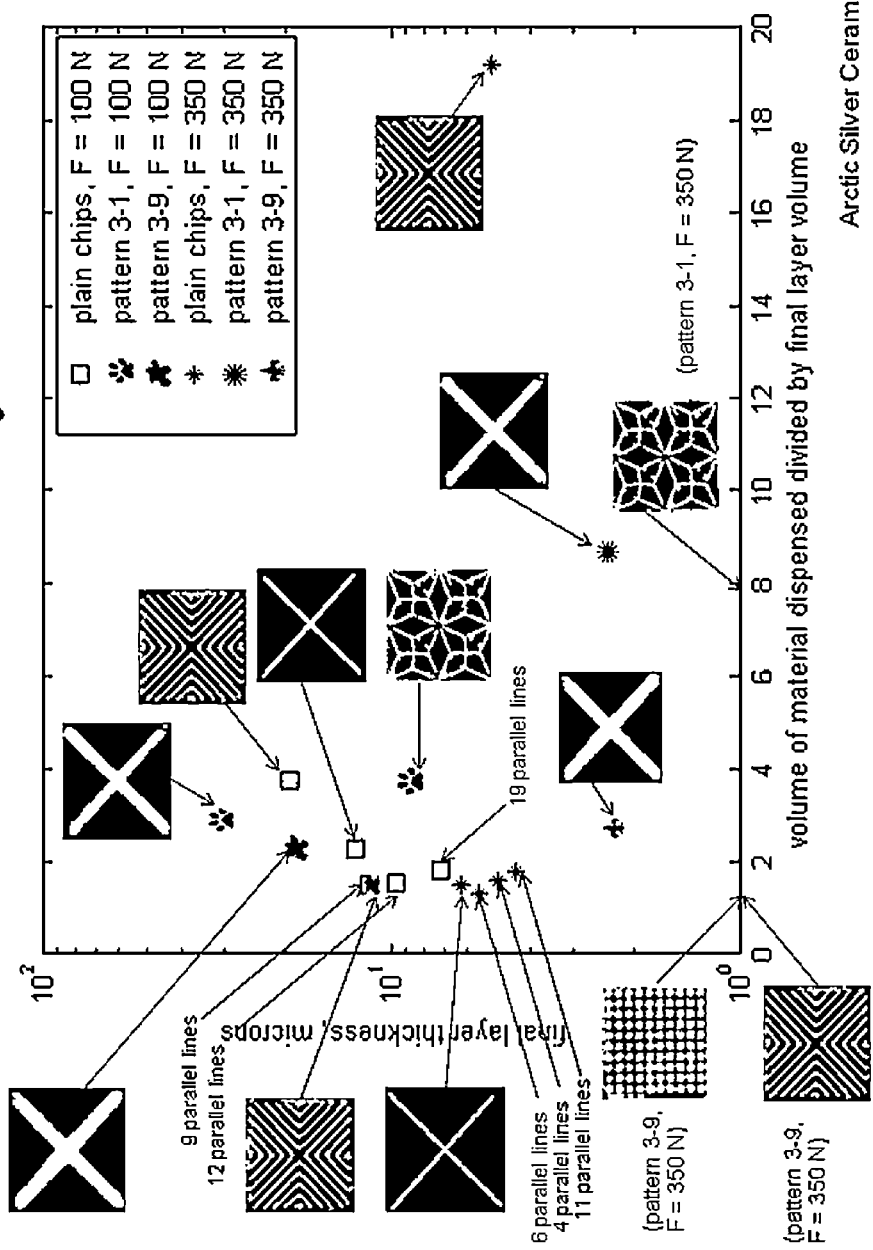
Figure 12:
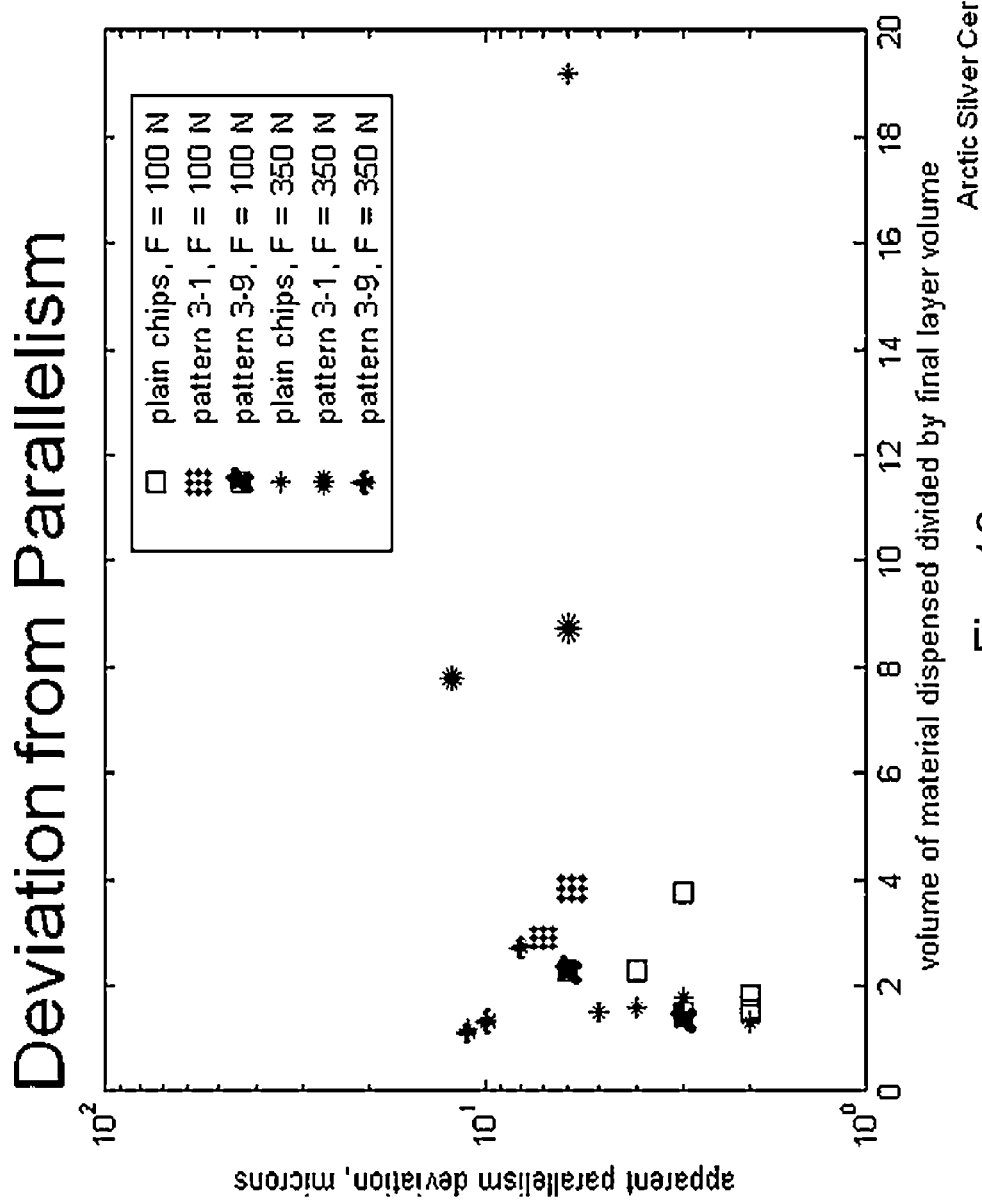

As illustrated in FIGS. 11 and 12, at equal force, any reduction in final layer thickness due to surface micro-channels is not large compared to measurement error/noise. The final layer thickness at 79 psi appears to be smaller than at 23 psi, however, the difference is not large compared to measurement error/noise. By varying the number and size of parallel lines dispensed on plain chips, final layer thickness can be decreased without any increase in squeezing force.

Figure 7C:
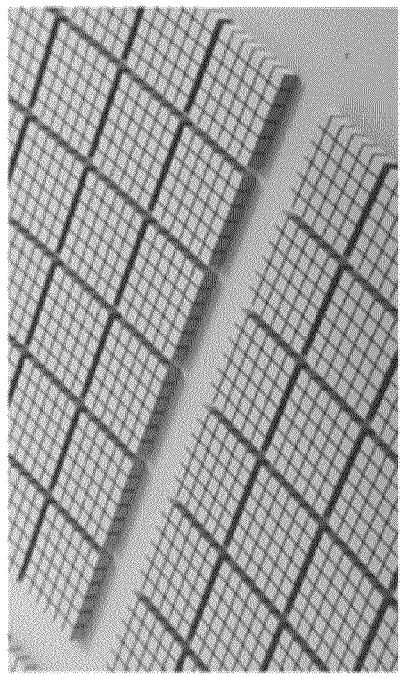
FIG. 7C shows surface micro-channels of the prior art according to Brunschwiler et al. (2007).
Figure 13:
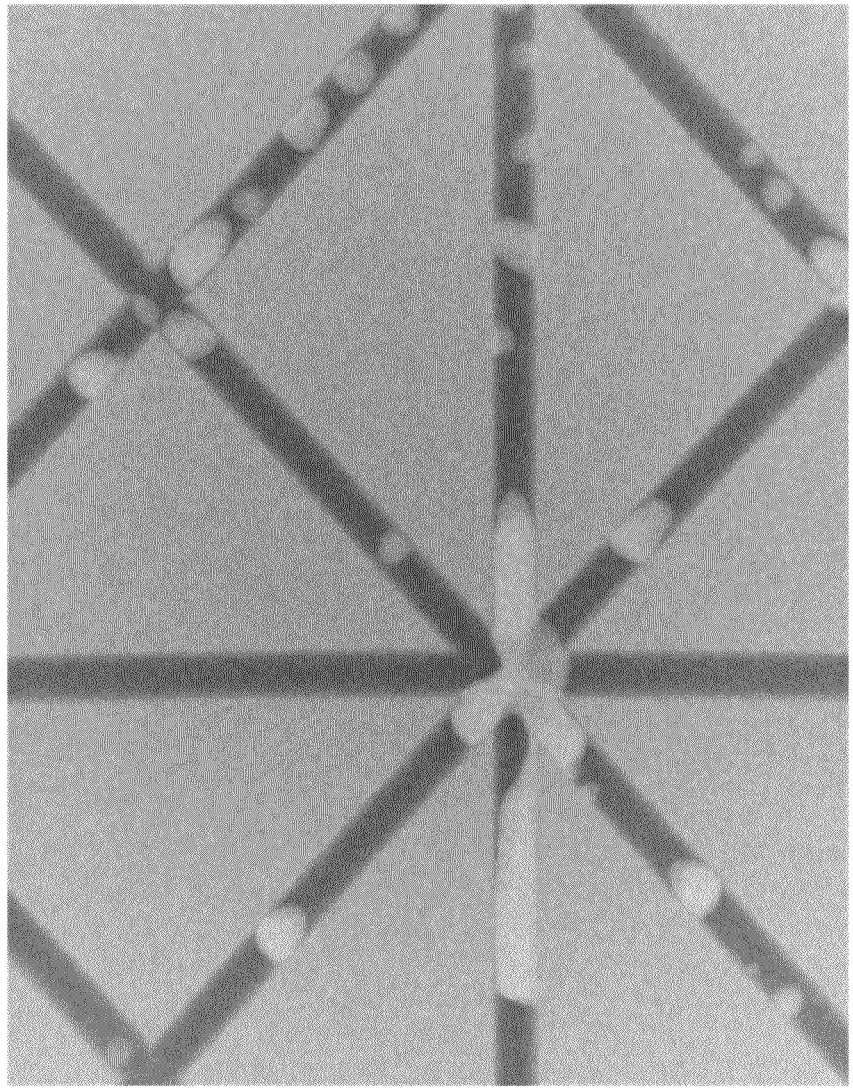
FIG. 13 shows air voids in Arctic Silver Ceramique High Density in surface micro-channels by X-ray observation.

Surface micro-channels resulted in final layers which appeared more wedge-shaped, though the difference is not large compared to measurement error/noise. Brunschwiler et al. (2007), using the design of FIG. 7C, reported that, " . . . squeezes (for chips with surface micro-channels) typically do not exhibit large deviations in squeeze response due to tilted plates because a re-leveling of the paste is possible within the HNC channels." Greater squeezing force also resulted in final layers which were wedge-shaped. This may have been an effect of a cantilevered construction of squeezing tester; the difference again is not large compared to measurement error/noise. All samples with surface micro-channels exhibited air voiding in the channels, as observed by X-ray (Arctic Silver Ceramique High Density), shown in FIG. 13.

It is noted that the amounts of the smallest deposits are not accurately known because of a lack of repeatability of our dispensing equipment at those small amounts. Current embodiments of commercial silicon die and heat sinks may not be flat enough to benefit from the fine parallel line dispensing technique; therefore, modified processes may be employed to benefit from these advantages. A large excess bead of thermal grease may be desirable to act as a reservoir to combat pump-out. For dispenses with little excess, perhaps this bead could be quickly dispensed around the perimeter after the minimalist dispense has spread to fill the joint. Indeed, it may be possible to use a different composition of thermal grease for an external bead and the squeezed film; for example, a lesser particle loading or different viscous carrier composition of the bead may facilitate wicking into the void areas and rapid accommodation of thermal changes.

Surface micro-channels are claimed to combat pump-out by acting as reservoirs. It has been shown that minimalist dispensing (in fine parallel lines) can compete with the squeezing speed afforded by surface micro-channels, but the contribution of surface micro-channels to reliability could make them the best choice overall.

Improvements and modifications can be made to the foregoing without departing from the scope of the present invention.

REFERENCES

Incorporated Herein by Reference

Brunschwiler et al., "Thermal Interface with a Patterned Structure," US 2006l0286712 A1.

Covey and Stanmore, "Use of the Parallel-Plate Plastometer for the Characterization of Viscous Fluids with a Yield Stress," Journal of Non-Newtonian Fluid Mechanics, V. 8, 249-260, 1981.

Davidson et al., "Study of a Gel Thermal Interface Material with Micron-Size Particles," Proceedings ITHERM 2006.

Linderman et al., "Hierarchical Nested Surface Channels for Reduced Particle Stacking and Low Resistance Thermal Interfaces," Proceedings IEEE SEMI-THERM 2007.

Mahajan et al., "Cooling a Microprocessor Chip," Proceedings of the IEEE, Vol. 94, No. 8, 1476-86, August, 2006.

Prasher, R. S., "Thermal Interface Materials: Historical Perspective, Status, and Future Directions," Proceedings of the IEEE, Vol. 94, No. 8, 1571-86, August 2006.

Sushumna et al., "Stable, Highly-Concentrated Suspensions for Electronic and Ceramic Materials Applications," Journal of Materials Research, Vol. 6, No. 5, 1082-93, May 1991.

Smith, Brian, et al., "Design Of Thermal Interfaces With Embedded Microchannels To Control Bond Line Formation", IEEE 11th Intersociety Conference on Thermal and Thermomechanical Phenomena in Electronic Systems, 2008 (ITHERM 2008), pp. 410-418, May 2008.

What is claimed is:

1. A thermal interface, comprising:
   a first surface;
   a second surface; and
   a heat-conducting interface material comprising a liquid filled with solid particles, disposed between the first surface and the second surface in a final layer,
   wherein the interface material has thermal properties selectively resulting from a deposited suitable pattern of the liquid filled with solid particles having at least one gas space between regions of the deposited pattern, squeezed to cause a flow pattern which eliminates the at least one gas space and voids, having location-dependent thermal properties resulting from the flow pattern, wherein the deposited suitable pattern is optimized according to a computational fluid dynamics model.

2. The interface of claim 1 in which the suitable pattern comprises a set of parallel lines.

3. The interface of claim 1, in which the suitable pattern comprises a pattern of locations and respective amounts which are selected such that the shear yield stress of the heat conducting material controls a thickness of the thin final layer.

4. The interface of claim 1, in which the suitable pattern comprises a pattern of locations and respective amounts which are selected such that particle agglomeration of the solid particles in the liquid controls a final thickness of the thin layer.

5. The interface of claim 1, wherein the suitable pattern comprises a branched tree-like structure.

6. The interface of claim 1, wherein the flow pattern is optimized according to one or more criteria selected from the group consisting of processing time, peak squeezing force, average squeezing force, squeezing force profile, thermal conductivity, operating temperature, prescribed thermal conductivity as a function of location, prescribed temperature conductivity as a function of location, peak operating temperature as a function of location, cost, cost-benefit, and yield.

7. The interface of claim 1, in which the suitable pattern comprises a set of lines which are spaced at a pitch smaller than 10% of a side length of the first surface.

8. The interface of claim 1, in which the suitable pattern comprises a set of at least 10 islands.

9. The interface of claim 1, in which the flow pattern results from a squeezing pressure of less than 10 psi.

10. The interface of claim 1, in which the thickness of the final layer is 20 microns or smaller.

11. The interface of claim 1, wherein the flow pattern results from squeezing of the interface material between the first surface and the second surface over a controlled processing time.

12. The interface of claim 1, wherein the flow pattern results from squeezing of the interface material between the first surface and the second surface subject to a controlled peak squeezing force.

13. The interface of claim 1, wherein the flow pattern results from squeezing of the interface material between the first surface and the second surface subject to a controlled average squeezing force.

14. The interface of claim 1, wherein the flow pattern results from squeezing of the interface material between the first surface and the second surface subject to a controlled squeezing force profile.

15. The interface of claim 1, wherein the flow pattern results from squeezing of the interface material between the first surface and the second surface to achieve a predetermined thermal conductivity.

16. The interface of claim 1, wherein the solid particles comprise micron-sized isotropic particles, having an alignment dependent on a flow of the liquid filled with the solid particles.

17. The interface of claim 1, wherein the flow pattern results from squeezing of the interface material between the first surface and the second surface to achieve a prescribed thermal conductivity as a function of location.

18. The interface of claim 1, wherein the thermal interface is configured to result in a prescribed normal operating temperature as a function of location.

19. The interface of claim 1, wherein the thin final pattern thermal interface is configured to result in a peak operating temperature as a function of location.

20. The interface of claim 1, wherein the liquid filled with solid particles separates during flow, such that a particle-rich zone is formed corresponding to the deposited suitable pattern, and a less dense zone is formed in portions of the thermal interface which have flowed from the deposited suitable pattern.

21. The interface of claim 1, wherein the first surface comprises predetermined hotspots or heat sensitive regions, and the defined suitable pattern comprises regions of liquid filled with solid particles deposited to cover the hotspots or heat sensitive portions.

22. The interface of claim 1, wherein the deposited suitable pattern is defined to minimize at least one of a squeezing time and a squeezing pressure required to achieve the thin final layer.

23. A thermal interface, comprising:
 a first surface;
 a second surface; and
 a substantially heat-conducting interface material comprising a liquid filled with solid particles,
 formed by a process comprising:
  depositing the interface material between the first surface and the second surface in a deposition pattern having spaces between regions of the interface material in a suitable pattern optimized according to a computational fluid dynamics model,
  applying a squeezing pressure across the interface material, and
  spreading out the interface material to form a thin voidless final layer,
 wherein the deposition pattern of the interface material is optimized according to one or more criteria selected from the group consisting of processing time, peak squeezing force, average squeezing force, squeezing force profile, thermal conductivity, operating temperature, prescribed thermal conductivity as a function of location, peak operating temperature as a function of location, cost, cost-benefit, and yield.

* * * * *